US010776019B2

(12) United States Patent
Watanabe

(10) Patent No.: US 10,776,019 B2
(45) Date of Patent: Sep. 15, 2020

(54) MEMORY SYSTEM AND METHOD OF CONTROLLING NONVOLATILE MEMORY

(71) Applicant: Toshiba Memory Corporation, Minato-ku (JP)

(72) Inventor: Daiki Watanabe, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 252 days.

(21) Appl. No.: 15/914,151

(22) Filed: Mar. 7, 2018

(65) Prior Publication Data

US 2019/0087107 A1 Mar. 21, 2019

(30) Foreign Application Priority Data

Sep. 20, 2017 (JP) .................................. 2017-180716

(51) Int. Cl.
*G06F 3/06* (2006.01)
*G06F 17/18* (2006.01)
(Continued)

(52) U.S. Cl.
CPC ............ *G06F 3/0619* (2013.01); *G06F 3/064* (2013.01); *G06F 3/0629* (2013.01);
(Continued)

(58) Field of Classification Search
CPC ............ G06F 11/1012; G06F 11/1068; G06F 11/1048; G06F 11/1072; H03M 13/1111;
(Continued)

(56) References Cited

U.S. PATENT DOCUMENTS 7,373,585 B2 5/2008 Yedidia et al.
8,438,457 B2 5/2013 Koshiyama et al.
(Continued)

FOREIGN PATENT DOCUMENTS

JP 5039160 10/2012
JP 5068537 11/2012
(Continued)

*Primary Examiner* — Jigar P Patel
(74) *Attorney, Agent, or Firm* — Oblon, McClelland, Maier & Neustadt, L.L.P.

(57) ABSTRACT

According to one embodiment, a memory system includes an intermediate value memory that holds decoded words of first and second component codes and reliability information and calculates a soft-input value of the first component code based on at least a decoded word concerning the second component code and reliability information and read information, decodes the soft-input value of the first component code, thereby calculating a decoded word of the first component code and reliability information, updates the intermediate value memory with the calculated decoded word and reliability information, calculates a soft-input value of the second component code based on at least the decoded word of the first component code and the reliability information and read information, decodes the soft-input value of the second component code, thereby calculating a decoded word of the second component code and reliability information, and updates the intermediate value memory with the calculated decoded word and reliability information.

19 Claims, 8 Drawing Sheets

(51) Int. Cl.
  *G06F 11/07*    (2006.01)
  *G06F 11/10*    (2006.01)
  *H03M 13/29*    (2006.01)

(52) U.S. Cl.
  CPC .......... *G06F 3/0679* (2013.01); *G06F 11/073* (2013.01); *G06F 11/1012* (2013.01); *G06F 17/18* (2013.01); *H03M 13/2909* (2013.01)

(58) Field of Classification Search
  CPC ......... H03M 13/1108; H03M 13/2906; H03M 13/1515; H03M 13/2909
  See application file for complete search history.

(56) References Cited

U.S. PATENT DOCUMENTS

| | | | |
|---|---|---|---|
| 8,572,465 B2 | 10/2013 | Uchikawa et al. | |
| 8,625,347 B2 | 1/2014 | Sakurada | |
| 2003/0145269 A1* | 7/2003 | Kuo | H04L 1/0003 |
| | | | 714/749 |
| 2005/0138520 A1* | 6/2005 | Richardson | H03M 13/1111 |
| | | | 714/755 |
| 2014/0289584 A1* | 9/2014 | Chilappagari | G06F 11/1068 |
| | | | 714/755 |
| 2015/0349807 A1* | 12/2015 | Vernon | H03M 13/353 |
| | | | 714/774 |
| 2016/0182087 A1* | 6/2016 | Sommer | H03M 13/1148 |
| | | | 714/752 |

FOREIGN PATENT DOCUMENTS

| | | |
|---|---|---|
| JP | 2013-080450 | 5/2013 |
| JP | 5540969 | 7/2014 |

\* cited by examiner

MEMORY SYSTEM AND METHOD OF CONTROLLING NONVOLATILE MEMORY

CROSS-REFERENCE TO RELATED APPLICATIONS

This application is based upon and claims the benefit of priority from Japanese Patent Application No. 2017-180716, filed on Sep. 20, 2017; the entire contents of all of which are incorporated herein by reference.

FIELD

Embodiments described herein relate generally to a memory system and a method of controlling a nonvolatile memory.

BACKGROUND

In a memory system, generally, in order to protect data to be stored, the data is error-correcting-coded and stored. Thus, in reading data stored in the memory system, decoding is performed on error-correcting-coded data.

DETAILED DESCRIPTION

Figure 1:
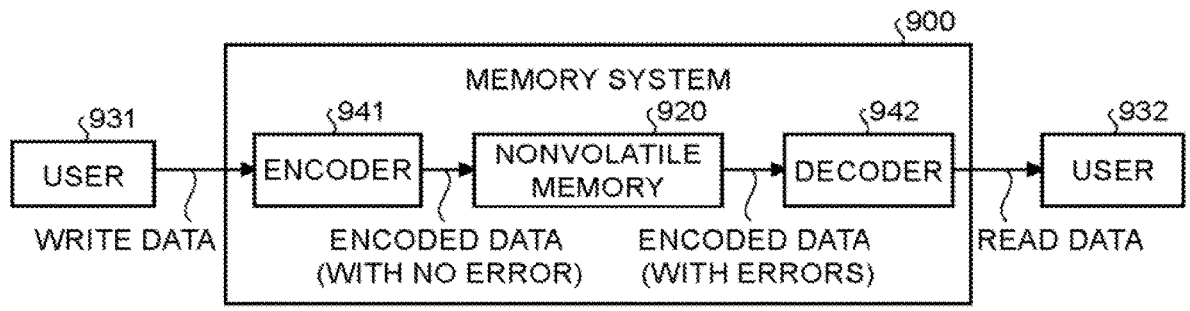
FIG. 1 is a diagram for explaining a general flow of operation of protecting data with use of an error correcting code.

According to one embodiment, a memory system is provided which includes a nonvolatile memory that records a multidimensional error correcting code in which at least one symbol from among symbols constituting a code is protected by at least a first component code and a second component code different from the first component code; a memory interface that reads the multidimensional error correcting code recorded in the nonvolatile memory in the form of soft-decision values as read information; a read information memory that holds the read information; an intermediate value memory that holds a first decoded word of the first component code and first reliability information concerning the first decoded word and a second decoded word of the second component code and second reliability information concerning the second decoded word; a first soft-input value calculating unit that calculates a first soft-input value of the first component code based on at least the second decoded word and the second reliability information held in the intermediate value memory and read information concerning the second component code held in the read information memory; a first soft-decision decoder that decodes the first soft-input value of the first component code for the first component code, thereby calculating a new first decoded word of the first component code and new first reliability information concerning the new first decoded word and updates the first decoded word and the first reliability information in the intermediate value memory with the calculated new first decoded word and the calculated new first reliability information, the new first decoded word and the new first reliability information in the intermediate value memory being a latest first decoded word and a latest first reliability information; a second soft-input value calculating unit that calculates a second soft-input value of the second component code based on at least the first decoded word and the first reliability information held in the intermediate value memory and read information concerning the first component code held in the read information memory; and a second soft-decision decoder that decodes the second soft-input value of the second component code for the second component code, thereby calculating a new second decoded word of the second component code and new second reliability information concerning the new second decoded word and updates the second decoded word and the second reliability information in the intermediate value memory with the calculated new second decoded word and the calculated new second reliability information, the new second decoded word and the new second reliability information in the intermediate value memory being a latest second decoded word and a latest second reliability information, wherein if it is determined that an output decoded word calculated from the read information, the first and second decoded words, and the first and second reliability information is a correct output decoded word, the output decoded word is outputted.

Memory systems and methods of controlling a nonvolatile memory according to embodiments will be described in detail below with reference to the accompanying drawings. The present invention is not limited to the following embodiments.

In these years, memory systems using a nonvolatile memory such as a NAND flash memory are being used in various places with their virtue of high-speed-ability being fully utilized. However, data read from a nonvolatile memory may include errors due to the time passage since recorded into the nonvolatile memory, noise occurring in reading and writing, or the like. Thus, generally, an encoding process using an error correcting code is performed on data to be recorded into a nonvolatile memory, and a decoding process using the error correcting code is performed in reading, so that errors contained in the read data are removed.

FIG. 1 is a diagram for explaining a general flow of operation of protecting data with use of an error correcting code. Note that the user in this description may be an information processing device such as a personal computer, a server, a portable information device, or a digital still camera.

A user 931 transmits data to be written (hereinafter called write data) to a memory system 900. The memory system 900 encodes write data received from the user 931 with use of an encoder 941 and writes the created encoded data (code words) into a nonvolatile memory 920. Thus, basically the encoded data written in the nonvolatile memory 920 does not contain an error.

Encoded data stored in the nonvolatile memory 920 is read according to a read request from, for example, a user 932. Here, the read encoded data may contain an error. Accordingly, decoding is performed with removing errors contained in the read encoded data using a decoder 942, so that original code words are reconstructed. Then the original code words or reconstructed un-encoded write data before is transmitted to the user 932. The user 932 that issued the read request may be the same user as the user 931 that issued the write request, or another user.

Here, consider the case where the encoder 941 encodes write data into a code word constituted by binary information (bits) represented by values '0' or '1' and where the code word is recorded as binary information in the nonvolatile memory 920. Hereinafter, in reading data from the nonvolatile memory 920, if recorded data is read as binary information indicating whether each bit is 0 or 1 so as to be inputted to the decoder 942, the inputted information is referred to as hard-input. In contrast, if recorded data is read as information about the probability of each bit being 0 or the probability of being 1 so as to be inputted to the decoder 942, the probability information is referred to as soft-input.

Further, if the decoding result outputted by the decoder 942 is binary information indicating whether each bit of the original write data is 0 or 1, the outputted information is referred to as hard-output. In contrast, if the decoding result outputted by the decoder 942 includes information about the probability of each bit of the original write data being 0 or the probability of being 1, the outputted information is referred to as soft-output.

If soft-input is used as input to the decoder 942, decoding with use of more information is possible as compared with the case of using hard-input. Thus, if read data contains many errors, using soft-input as input to the decoder 942 can increase the probability of decoding into correct data.

For example, for binary code in which information is represented in the form of bits each taking on 0 or 1, a Log-Likelihood-Ratio (LLR) representation, which is the natural logarithm of the ratio of the probability of the bit being 0 to the probability of being 1, is often used as a soft-input value and a soft-output value. Because a code word of binary code can be denoted as a vector of bit values, the soft-input value and soft-output value of binary code can be denoted as a vector of LLRs (real values). Although the embodiments below illustrate the case where probability information of the soft-input value and soft-output value is denoted as a vector of LLRs for simplicity of description, not being limited to this case, various modifications are possible.

A decoder which performs soft-output for soft-input (hereinafter called a Soft-Input Soft-Output (SISO) decoder) can be used as, for example, a component code decoder for a multidimensional error correcting code.

Here, the multidimensional error correcting code refers to an error correcting code in which at least one symbol, which is a constituent unit, is protected by a plurality of component codes of a smaller scale in a multiple manner. Further, one symbol is constituted by, e.g., one bit (an element of a binary field) or an element of an alphabet such as a finite field other than a binary field.

Figure 2:
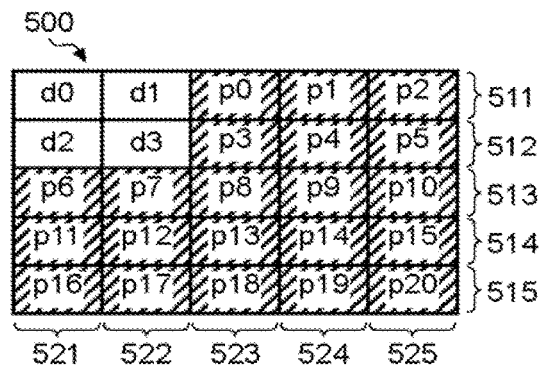
FIG. 2 is a diagram illustrating an example iterated code.

FIG. 2 illustrates an iterated code as an example of the multidimensional error correcting code. The iterated code 500 illustrated in FIG. 2 has a structure where information bits (or symbols) $d_0$ to $d_3$, which are constituent units, are protected by Hamming codes 511 to 515 and 521 to 525 having an information length of two bits and a parity length of three bits which are arranged in a row direction (a horizontal direction in the drawing) and a column direction (a vertical direction in the drawing). In this iterated code 500, all the information bits do to $d_3$ and parity bits $p_0$ to $p_{20}$ are double protected by row-direction Hamming codes and column-direction Hamming codes. In the iterated code shown in FIG. 2, all the symbols are double protected by row-direction (called Dimension 1) and column-direction (called Dimension 2) component codes. Not being limited to this, the multidimensional error correcting code may be, for example, a generalized Low Density Parity Check (LDPC) code or the like. In general multidimensional error correcting codes including the generalized LDPC code, the multiplicity of protection may be different for each symbol, and, although component codes cannot be divided into groups such as Dimension 1 and Dimension 2, the present technique can be applied to such a code configuration as well.

Figure 3:
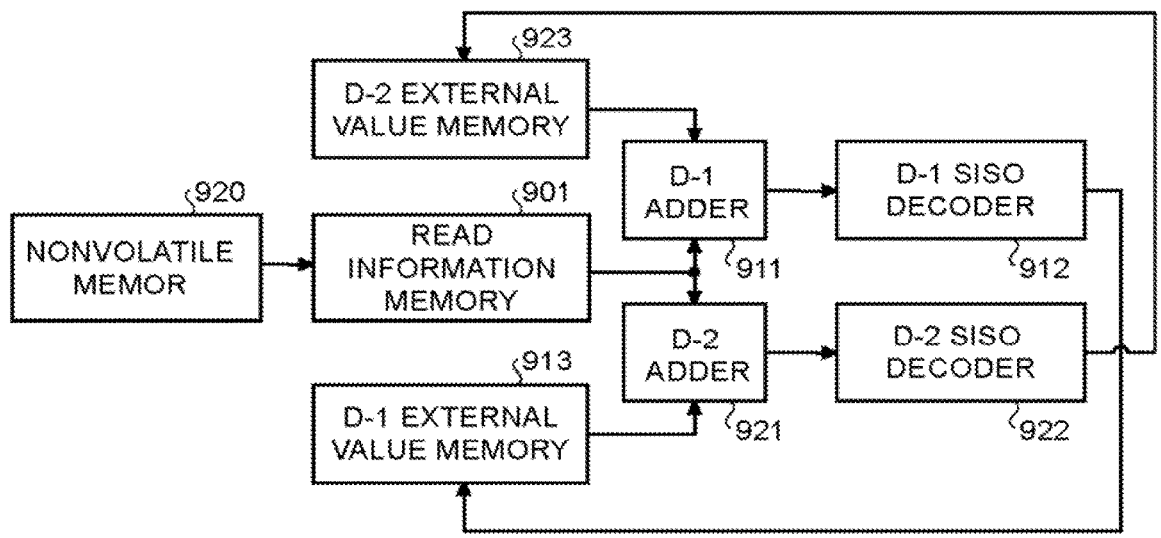
FIG. 3 is a block diagram illustrating an example function block that performs turbo decoding on a two-dimensional error correcting code.
Figure 4:
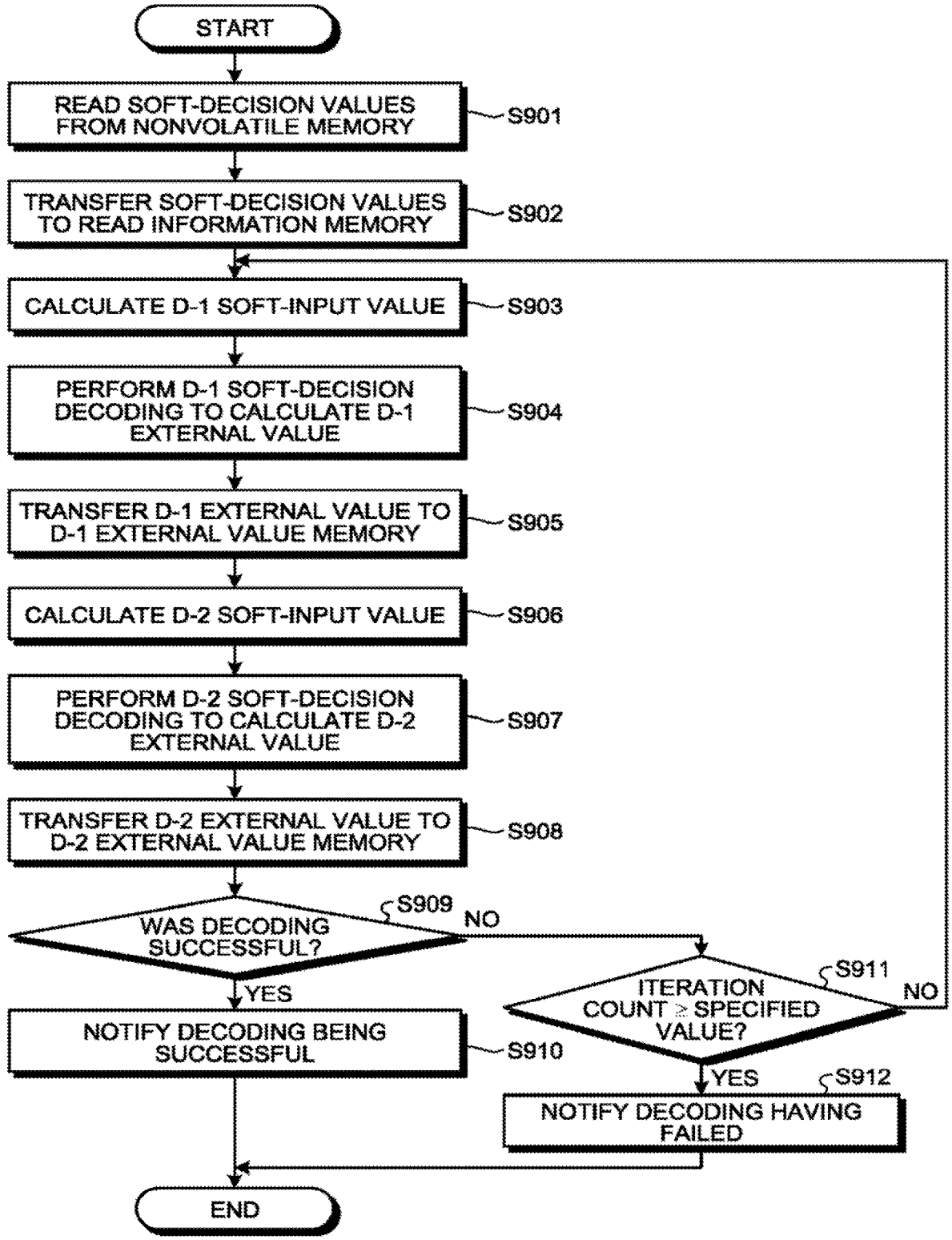
FIG. 4 is a flow chart illustrating an example processing flow by the function block shown in FIG. 3.

Turbo decoding can be performed on such a multidimensional error correcting code. FIG. 3 is a diagram illustrating an example function block that performs turbo decoding on a two-dimensional error correcting code. FIG. 4 is a flow chart illustrating an example processing flow by the function block shown in FIG. 3.

As illustrated in FIG. 3, the function block, which performs turbo decoding on a two-dimensional error correcting code, includes a read information memory 901, a dimension-1 adder 911, a dimension-1 SISO decoder 912, a dimension-1 external value memory 913, a dimension-2 adder 921, a dimension-2 SISO decoder 922, and a dimension-2 external value memory 923.

In the turbo decoding operation by this function block, as illustrated in FIG. 4, first the error correcting code is read in the form of soft-decision values from the nonvolatile memory 920 (step S901). The read error correcting code in the form of soft-decision values is transferred to and stored as read information into the read information memory 901 (step S902).

Then the dimension-1 adder 911 adds read information in the read information memory 901 and a dimension-2 external value in the dimension-2 external value memory 923 so as to calculate a dimension-1 soft-input value (=the read information+the dimension-2 external value) (step S903). It is assumed that both the dimension-1 external value memory 913 and the dimension-2 external value memory 923 have been reset (zero cleared) at the start of the present operation.

Then the dimension-1 soft-input value calculated by the dimension-1 adder 911 is inputted to the dimension-1 SISO decoder 912 on a component-code-by-component-code basis. The dimension-1 SISO decoder 912 performs dimension-1 soft-decision decoding on the inputted dimension-1 soft-input value so as to calculate a dimension-1 external value (step S904). The calculated dimension-1 external value is transferred to and held in the dimension-1 external value memory 913 (step S905).

Then the dimension-2 adder 921 adds read information in the read information memory 901 and a dimension-1 external value in the dimension-1 external value memory 913 so as to calculate a dimension-2 soft-input value (=the read information+the dimension-1 external value) (step S906).

Then the dimension-2 soft-input value calculated by the dimension-2 adder 921 is inputted to the dimension-2 SISO decoder 922 on a component-code-by-component-code basis. The dimension-2 SISO decoder 922 performs dimension-2 soft-decision decoding on the inputted dimension-2 soft-input value so as to calculate a dimension-2 external value (step S907). The calculated dimension-2 external value is transferred to and held in the dimension-2 external value memory 923 (step S908).

Then it is determined whether the decoding was successful (step S909). The decoding being successful may mean, for example, that a decoded word determined to be correct is found or so on. If the decoding was successful (Yes at step S909), the found decoded word together with the decoding being successful is notified to an external control unit or the like (step S910), the present operation finishes. On the other hand, if the decoding was not successful (No at step S909), it is determined whether the iteration count of the present operation has reached a preset specified value (step S911), and if the specified value has not been reached (No at step S911), the process returns to step S903, and the subsequent operation is performed. If the specified value has been reached (Yes at step S911), the decoding having failed is notified to the external control unit or the like (step S912), the present operation ends. Note that the iteration count may be the number of times when the operations of, e.g., steps S903 to S908 of FIG. 4 have been repeated, or the like.

A Max-log-Maximum a Posteriori (Max-log-MAP) decoder, in which a decoding algorithm calculating external values is adopted, can be used as the dimension-1 SISO decoder 912 and the dimension-2 SISO decoder 922 in the configuration shown in FIG. 3. The Max-log-MAP decoder calculates a posteriori probability for each bit from a MAP decoded word and a competing decoded word for the bit. Hereinafter, for simplicity of description, a quantity proportional to the posteriori probability and its approximate values are also referred to as posteriori probabilities. For example, assuming that the prior probabilities of all the code words are equal, the likelihood of a decoded word is proportional to the posteriori probability of the decoded word.

Here, the MAP decoded word $c^*$ refers to the code word $c^* = \mathrm{argmax}_c P(c|S)$ whose posteriori probability P is the highest of those calculated from soft-input values S, from among all the code words $c \in C$. The competing decoded word for the ith bit refers to the code word $c_{p,\,i} = \mathrm{argmax}_c P(c|S, c_i \neq c^*_i)$ whose posteriori probability P is the highest of those calculated from soft-input values S, from among the code words having a value different in the ith bit from the MAP decoded word $c^*$ from among all the code words $c \in C$. Thus, intermediate hard-decision values calculated during decoding in the Max-log-MAP decoder include the MAP decoded word $c^*$ and all the competing code words $c_{p,\,i}$.

Instead of the set C of all the code words, the set $C' (\subset C)$ of code words whose posteriori probabilities are relatively high may be used. In this case, an approximate MAP decoded word and an approximate competing decoded word for the ith bit are obtained. Max-log-MAP decoding using this subset C' of code words has the characteristic that high-speed decoding can be performed because of a reduction in calculation amount as compared with Max-log-MAP decoding using the set C of all the code words, although inferior in correcting capability. Hereinafter, for simplicity of description, also in the case where approximate MAP decoded words are used, they are called MAP decoded words.

In the Max-log-MAP decoding using the subset C' of code words, a logarithmic posteriori probability ratio R for the ith bit is approximately calculated from the posteriori probability ratio between the MAP decoded word $c^*$ and the competing decoded word $c_{p,\,1}$ using the following equation (1).

$$R = (1 - 2c_i) \ln\left(\frac{P(c^* | S)}{P(c_{p,i} | S)}\right) \quad (1)$$

The external value of each dimension can be obtained by subtracting the soft-input value $S_i$ from the logarithmic posteriori probability ratio R obtained using the equation (1). Although in the present description the Max-log-MAP decoding is taken as an example of the decoding algorithm that calculates external values from intermediate hard-decision values calculated during decoding, various decoding algorithms other than that can be used.

Because the turbo decoder using an SISO decoder as above needs to have external values, probability information, recorded in an external value memory, the volume of memory necessary for decoding may increase. Hence, it is desired to provide a memory system which can reduce the volume of memory required for decoding.

First Embodiment

Figure 5:
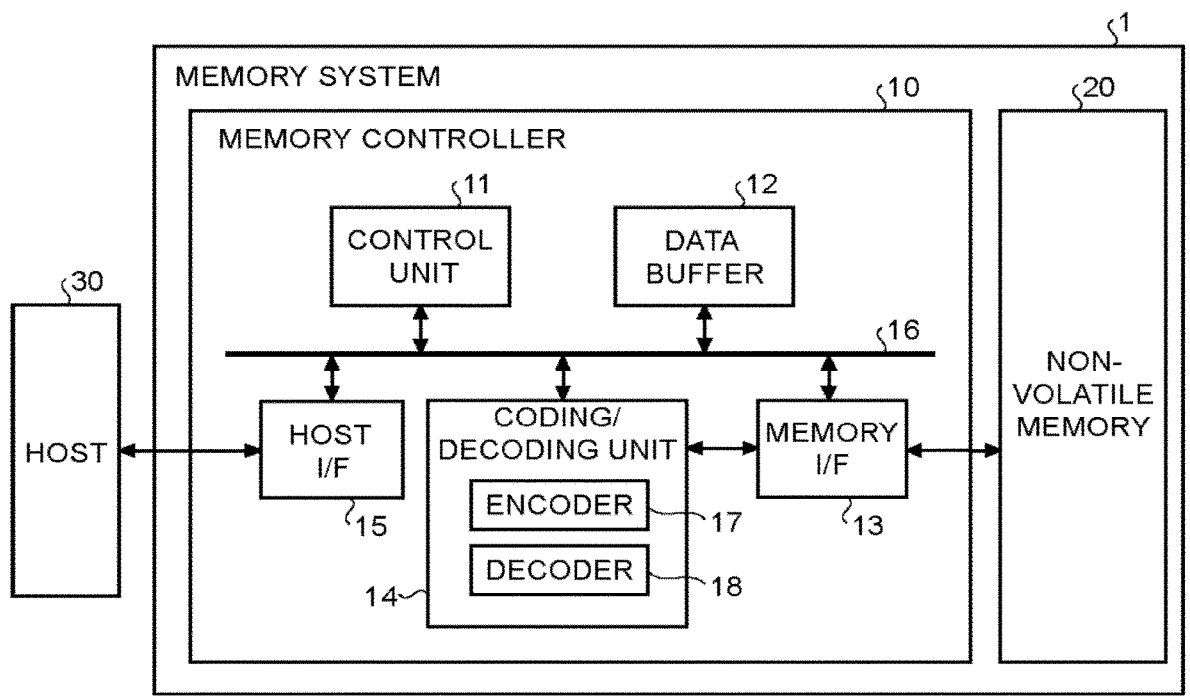
FIG. 5 is a block diagram schematically illustrating an example configuration of a memory system according to a first embodiment.

FIG. 5 is a block diagram schematically illustrating an example configuration of a memory system according to a first embodiment. As illustrated in FIG. 5, the memory system 1 comprises a memory controller 10 and a nonvolatile memory 20. The memory system 1 can be connected to a host 30, and FIG. 5 shows the state of being connected to the host 30. The host 30 may be an electronic device such as a personal computer, a mobile terminal, or the like.

The nonvolatile memory 20 stores data in a nonvolatile manner and is, for example, a NAND flash memory (hereinafter simply called a NAND memory). Although the description below illustrates the case where a NAND memory is used as the nonvolatile memory 20, a storage device other than a NAND memory, such as a three dimensionally structured flash memory, a Resistance Random Access Memory (ReRAM), or a Ferroelectric Random Access Memory (FeRAM), can also be used as the nonvolatile memory 20. Further, it is not essential that the nonvolatile memory 20 is a semiconductor memory, but the present embodiment can also be applied to various storage media other than a semiconductor memory.

The memory system 1 may be a memory card or the like that contains the memory controller 10 and the nonvolatile memory 20 in one package, or a Solid State Drive (SSD).

The memory controller 10 controls writing into the nonvolatile memory 20 according to a write request from the host 30 and controls reading from the nonvolatile memory 20 according to a read request from the host 30. The memory controller 10 comprises a host interface (I/F) 15, a memory interface (I/F) 13, a control unit 11, a coding/decoding unit (codec) 14, and a data buffer 12. The host I/F 15, the memory I/F 13, the control unit 11, the coding/decoding unit 14, and the data buffer 12 are connected to each other by an internal bus 16.

The host I/F 15 performs processing compliant with the standard of the interface with the host 30 to output an instruction, user data to be written, or the like received from the host 30 onto the internal bus 16. Further, the host I/F 15 transmits user data read from the nonvolatile memory 20 and reconstructed, a response from the control unit 11, or the like to the host 30.

The memory I/F 13 performs processing of writing into the nonvolatile memory 20 according to an instruction from the control unit 11. Further, the memory I/F 13 performs processing of reading from the nonvolatile memory 20 according to an instruction from the control unit 11.

The control unit 11 controls the constituents of the memory system 1 overall. When receiving an instruction from the host 30 via the host I/F 15, the control unit 11 performs control according to the instruction. For example, the control unit 11 instructs the memory I/F 13 to write user data and parity into the nonvolatile memory 20 according to an instruction from the host 30. Further, the control unit 11 instructs the memory I/F 13 to read user data and parity from the nonvolatile memory 20 according to an instruction from the host 30.

When receiving a write request from the host 30, the control unit 11 determines a storage area (memory area) in the nonvolatile memory 20 for user data accumulated in the data buffer 12. That is, the control unit 11 manages write destinations for user data. The correspondence between the logical address of user data received from the host 30 and the physical address referring to the storage area in the nonvolatile memory 20 where that user data is stored, is stored as part of an address conversion table.

When receiving a read request from the host 30, the control unit 11 converts the logical address specified by the read request into a physical address using the address conversion table and instructs the memory I/F 13 to read data at the physical address.

In NAND memories, generally writing and reading are performed in data units called pages, and erasing is performed in data units called blocks. In the present embodiment, a memory cell group refers to a plurality of memory cells connected to the same word line. In the case where the memory cells are single-level cells (SLCs), one memory cell group corresponds to one page. In the case where the memory cells are multi-level cells (MLCs), one memory cell group corresponds to a plurality of pages. Each memory cell is connected to a word line and also connected to a bit line. Thus, each memory cell can be identified by the address to identify the word line and the address to identify the bit line.

The data buffer 12 temporarily stores user data received from the host 30 until the memory controller 10 stores the user data into the nonvolatile memory 20. Or the data buffer 12 temporarily stores user data read from the nonvolatile memory 20 until the user data is transmitted to the host 30. A general-purpose memory such as a Static Random Access Memory (SRAM) or a Dynamic Random Access Memory (DRAM) can be used as the data buffer 12.

User data transmitted from the host 30 is transferred onto the internal bus 16 and is temporarily stored in the data buffer 12. The coding/decoding unit 14 encodes user data to be stored into the nonvolatile memory 20 to create code words. The coding/decoding unit 14 decodes received words read from the nonvolatile memory 20 to reconstruct user data. The coding/decoding unit 14 comprises an encoder 17 and a decoder 18. Note that data encoded by the coding/decoding unit 14 may include control data and the like used in the memory controller 10 as well as user data.

Next, write processing in the present embodiment will be described. The control unit 11 instructs the encoder 17 to encode user data in writing into the nonvolatile memory 20.

At this time, the control unit 11 determines a storage area (storage address) for code words in the nonvolatile memory 20 and notifies the determined storage area to the memory I/F 13.

The encoder 17 encodes user data in the data buffer 12 according to an instruction from the control unit 11 to create code words. As the encoding method, one which uses a Bose-Chandhuri-Hocquenghem (BCH) code or a Reed-Solomon (RS) code can be adopted. The code words created by the encoder 17 are a multidimensional error correcting code such as the iterated code 500 illustrated previously using FIG. 2. The iterated code 500 illustrated in FIG. 2 has, as described previously, a structure where information bits (or symbols) $d_0$ to $d_3$, which are constituent units, are protected by component codes 511 to 515 and 521 to 525 that are Hamming codes having an information length of two bits and a parity length of two bits which are arranged in a row direction (a horizontal direction in the drawing) and a column direction (a vertical direction in the drawing). In this iterated code 500, all the information bits $d_0$ to $d_3$ and parity bits $p_0$ to $p_{20}$ are double protected by row-direction component codes (Hamming codes) 511 to 515 and column-direction component codes (Hamming codes) 521 to 525. The memory I/F 13 performs control to store code words into the storage area in the nonvolatile memory 20 notified by the control unit 11.

Next, the processing in reading from the nonvolatile memory 20 of the present embodiment will be described. The control unit 11 instructs the memory I/F 13 to read, specifying an address in the nonvolatile memory 20 in reading from the nonvolatile memory 20. Further, the control unit 11 instructs the decoder 18 to start decoding. The memory I/F 13, according to the instruction from the control unit 11, reads received words at the specified address in the nonvolatile memory 20 and inputs the read received words to the decoder 18. The decoder 18 decodes the received words read from the nonvolatile memory 20.

Figure 6:
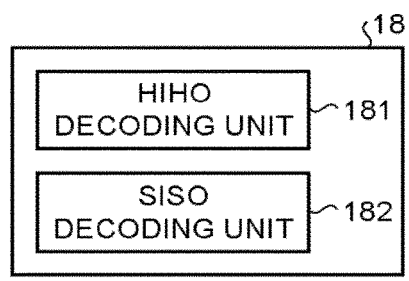
FIG. 6 is a block diagram schematically illustrating an example configuration of a decoder according to the first embodiment.

The decoder 18 decodes the received words read from the nonvolatile memory 20. FIG. 6 is a block diagram schematically illustrating an example configuration of the decoder 18. The decoder 18 comprises a hard-input hard-output (HIHO) decoding unit 181 that, having hard-decision values inputted thereto, performs decoding to output hard-decision values as a result and a soft-input soft-output (SISO) decoding unit 182 that, having soft-decision values inputted thereto, performs decoding to output soft-decision values as a result.

In general, the SISO decoding has the characteristic that the processing time is long, although higher in error-correcting capability than the HIHO decoding. Accordingly, in the present embodiment, the decoder 18 is configured such that first the HIHO decoding unit 181 HIHO-decodes received words read as hard-decision values from the nonvolatile memory 20, that then received words which could not be decoded by hard-decision decoding are read as soft-decision values, and that then the SISO decoding unit 182 SISO-decodes the received words read as soft-decision values. However, not being limited to this configuration, various modifications are possible such as the configuration where SISO-decoding is performed on all the received words with HIHO-decoding being omitted.

Figure 7:
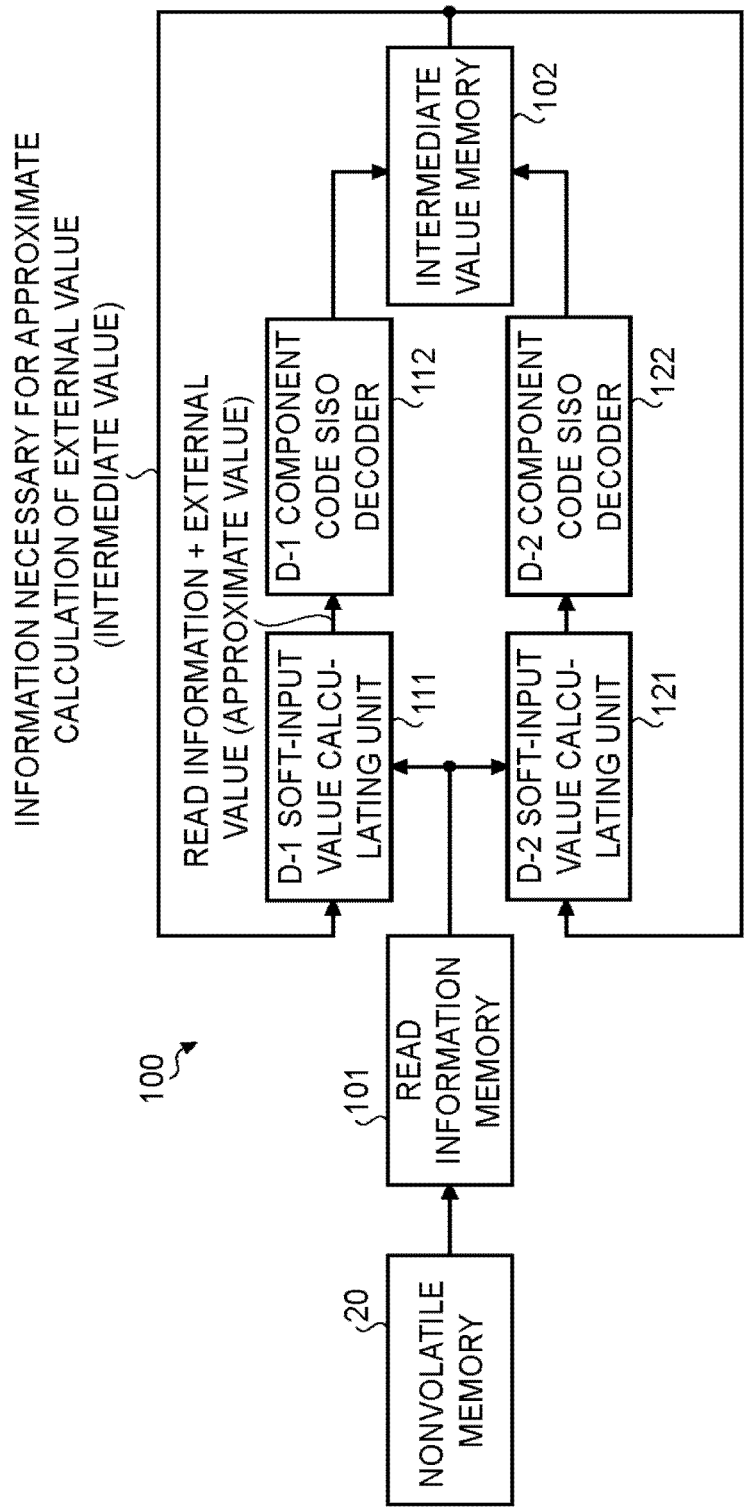
FIG. 7 is a block diagram schematically illustrating an example configuration of an approximating turbo decoder realized by an SISO decoding unit according to the first embodiment.
Figure 8:
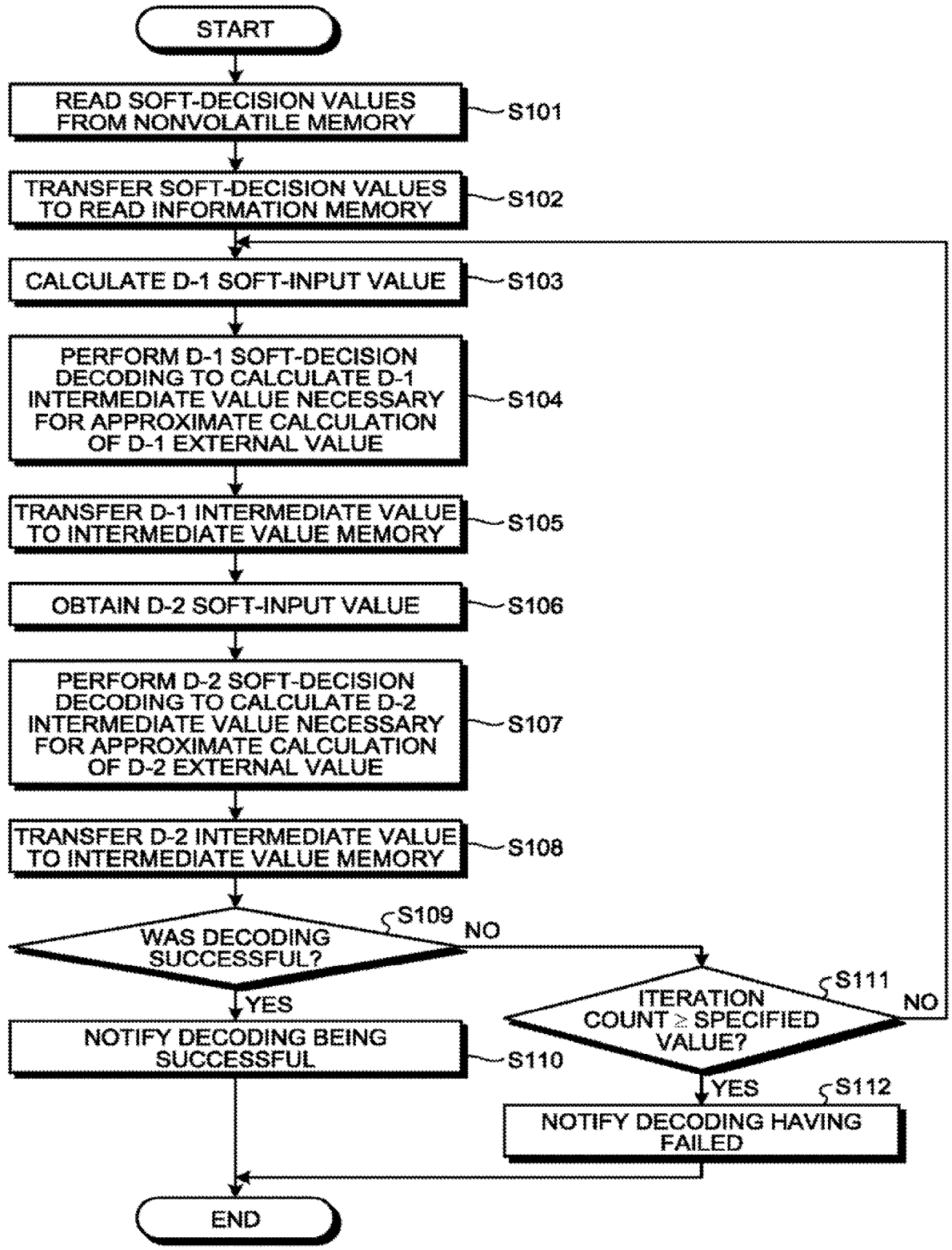
FIG. 8 is a flow chart illustrating an example processing flow of the approximating turbo decoder shown in FIG. 7.

Next, the configuration of the SISO decoding unit 182 shown in FIG. 6 will be described in more detail with reference to the drawing. FIG. 7 is a block diagram schematically illustrating an example configuration of an approximating turbo decoder realized by the SISO decoding unit according to the present embodiment. FIG. 8 is a flow chart illustrating an example processing flow of the approximating turbo decoder shown in FIG. 7.

As shown in FIG. 7, the approximating turbo decoder 100 realized by the SISO decoding unit 182 comprises a read information memory 101, an intermediate value memory 102, a dimension-1 soft-input value calculating unit 111, a dimension-1 component code SISO decoder 112, a dimension-2 soft-input value calculating unit 121, and a dimension-2 component code SISO decoder 122.

The dimension-1 soft-input value calculating unit 111 and the dimension-2 soft-input value calculating unit 121 calculate, for each component code, a soft-input value of each dimension from soft-decision values, read information, held in the read information memory 101 and dimension-1 intermediate values and dimension-2 intermediate values held in the intermediate value memory 102.

The intermediate value refers to information consisting of an intermediate hard-decision value of each component code calculated during decoding and reliability information of this intermediate hard-decision value and is information necessary for approximate calculation of the dimension-1 external value and dimension-2 external value. Reliability information of an intermediate hard-decision value (component code word) c is a metric indicating whether the probability that the component code word c calculated from a soft-input value (=probability information) is the original component code word is high or low. As reliability information for binary code, for example, a posteriori probability P calculated from a soft-input value S for a component code word c or the like can be used. However, not being limited to this, a variety of information such as a value indicating the probability that the component code word c is correct, the value of a distance function between the component code word c and soft-input value, or values after applying a logarithmic function or the like to those values can be used as reliability information.

The dimension-1 component code SISO decoder 112 and the dimension-2 component code SISO decoder 122 perform SISO decoding on an inputted soft-input value of each dimension for each component code to calculate an intermediate value of the dimension.

In turbo decoding operation by the approximating turbo decoder 100 shown in FIG. 7, as shown in FIG. 8, first the multidimensional error correcting code is read in the form of soft-decision values from the nonvolatile memory 20 (step S101). The read multidimensional error correcting code in the form of soft-decision values is transferred as read information to and stored into the read information memory 101 (step S102).

Then, read information in the read information memory 101 and a dimension-1 intermediate value and a dimension-2 intermediate value in the intermediate value memory 102 are inputted to the dimension-1 soft-input value calculating unit 111, which calculates a dimension-1 soft-input value (step S103). It is assumed that the intermediate value memory 102 has been reset (zero cleared) at the start of the present operation. Thus, in the processing of calculating the first dimension-1 soft-input value, for example, data of consecutive 0 bits as the dimension-1 intermediate value and dimension-2 intermediate value is inputted to the dimension-1 soft-input value calculating unit 111.

Then the dimension-1 soft-input value calculated in the dimension-1 soft-input value calculating unit 111 is inputted on a dimension-1-component-code-by-dimension-1-component-code basis to the dimension-1 component code SISO decoder 112, which calculates a dimension-1 intermediate value (step S104). The calculated dimension-1 intermediate value is transferred to and held in the intermediate value memory 102 (step S105).

Then, read information in the read information memory 101 and a dimension-1 intermediate value and a dimension-2 intermediate value in the intermediate value memory 102 are inputted to the dimension-2 soft-input value calculating unit 121, which calculates a dimension-2 soft-input value (step S106). At the time of calculating the first dimension-2 soft-input value, because no dimension-2 intermediate value is held in the intermediate value memory 102, in the processing of calculating the first dimension-2 soft-input value, a dimension-1 intermediate value and, for example, data of consecutive 0 bits are inputted to the dimension-2 soft-input value calculating unit 121.

Then the dimension-2 soft-input value calculated in the dimension-2 soft-input value calculating unit 121 is inputted on a dimension-2-component-code-by-dimension-2-component-code basis to the dimension-2 component code SISO decoder 122, which calculates a dimension-2 intermediate value (step S107). The calculated dimension-2 intermediate value is transferred to and held in the intermediate value memory 102 (step S108).

Then it is determined whether the decoding was successful (step S109). The decoding being successful may mean, for example, that a decoded word determined to be correct is found. Determination of whether a found decoded word is correct may be performed by, e.g., a control unit (not shown) in the coding/decoding unit 14. If the decoding was successful (Yes at step S109), the found decoded word together with the decoding being successful is notified to the external control unit 11 or the like (step S110), the present operation finishes. On the other hand, if the decoding was not successful (No at step S109), it is determined whether the iteration count of the present operation has reached a preset specified value (step S111), and if the specified value has not been reached (No at step S111), the process returns to step S103, and the subsequent operation is performed. If the specified value has been reached (Yes at step S111), the decoding having failed is notified to the external control unit 11 or the like (step S112), the present operation ends. Note that the iteration count may be the number of times when the operations of, e.g., steps S103 to S108 of FIG. 8 have been repeated, or the like.

Figure 9:
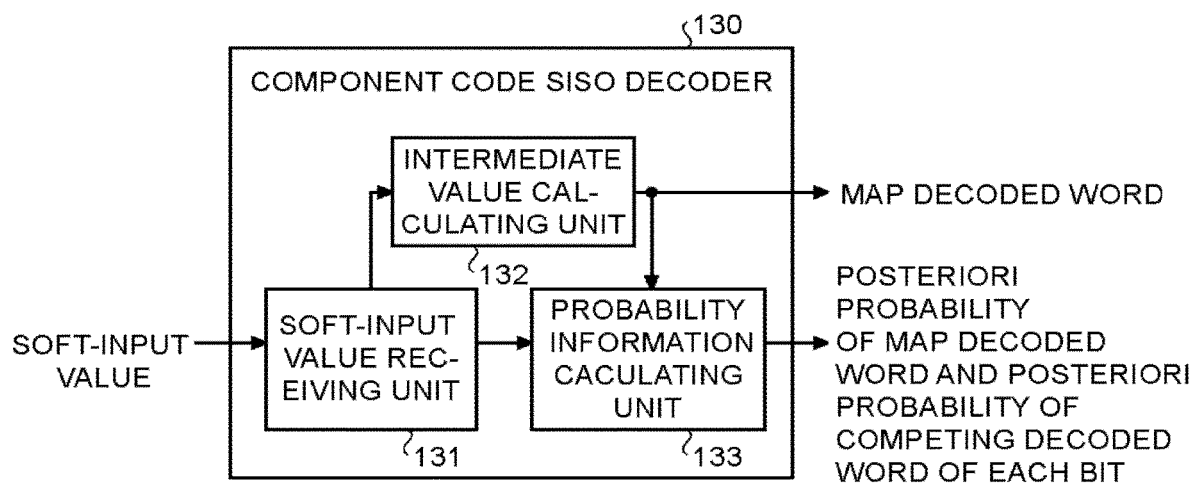
FIG. 9 is a block diagram schematically illustrating an example configuration of a component code SISO decoder according to the first embodiment.

Next, an example configuration of the component code SISO decoder used for each of the dimension-1 component code SISO decoder 112 and the dimension-2 component code SISO decoder 122 shown in FIG. 7 will be described in detail with reference to the drawing. FIG. 9 is a block diagram schematically illustrating an example configuration of the component code SISO decoder according to the present embodiment.

Each of the dimension-1 component code SISO decoder 112 and the dimension-2 component code SISO decoder 122, in the case of following the Max-log-MAP decoding algorithm described previously, can calculate a logarithmic posteriori probability ratio by storing three types of values for each component code word that are a MAP decoded word, the posteriori probability of the MAP decoded word, and the posteriori probability of the competing decoded word of each bit beforehand. Accordingly, the component code SISO decoder 130 according to the present embodiment comprises a soft-input value receiving unit 131, an intermediate value calculating unit 132, and a probability information calculating unit 133 as illustrated in FIG. 9.

The soft-input value receiving unit 131 receives a dimension-1 soft-input value or a dimension-2 soft-input value calculated by the dimension-1 soft-input value calculating unit 111 or the dimension-2 soft-input value calculating unit 121 to output the received soft-input value to each of the intermediate value calculating unit 132 and the probability information calculating unit 133.

The intermediate value calculating unit 132 performs a decoding process such as Chase decoding or Ordered Statistics decoding on the inputted dimension-1 soft-input value or dimension-2 soft-input value so as to calculate a MAP decoded word that corresponds to an intermediate hard-decision value for a component code subject to decoding to output the calculated MAP decoded word to each of the probability information calculating unit 133 and the intermediate value memory 102.

The probability information calculating unit 133 calculates, for the component code subject to decoding, the posteriori probability of the MAP decoded word and the posteriori probability of the competing decoded word of each bit from the dimension-1 soft-input value or the dimension-2 soft-input value inputted from the soft-input value receiving unit 131 and the MAP decoded word inputted from the intermediate value calculating unit 132 to output the calculated posteriori probability of the MAP decoded word and posteriori probability of the competing decoded word of each bit as reliability information to the intermediate value memory 102.

Thus, for the component code subject to decoding, the MAP decoded word that is an intermediate hard-decision value during decoding, and the posteriori probability of the MAP decoded word and the posteriori probability of the competing decoded word of each bit that are reliability information, are stored in the intermediate value memory 102.

Figure 10:
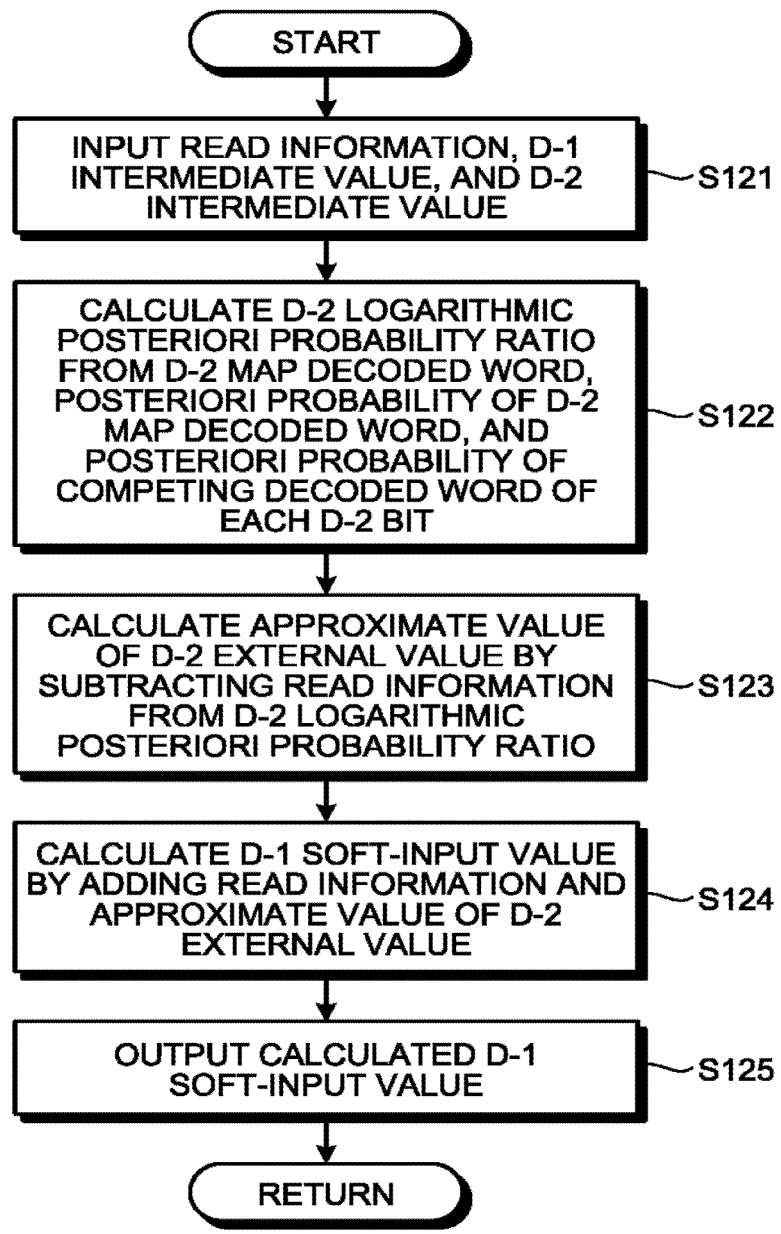
FIG. 10 is a flow chart illustrating an example operation flow of a dimension-1 soft-input value calculating unit according to the first embodiment.

Next, the operation flow where the dimension-1 soft-input value calculating unit 111 and the dimension-2 soft-input value calculating unit 121 of FIG. 7 calculate a dimension-1 soft-input value and a dimension-2 soft-input value in steps S103 and S106 of FIG. 8, will be described in detail with reference to the drawing. FIG. 10 is a flow chart illustrating an example operation flow of the dimension-1 soft-input value calculating unit according to the present embodiment. Although FIG. 10 illustrates the operation of the dimension-1 soft-input value calculating unit 111, regarding the operation, the same applies to the dimension-2 soft-input value calculating unit 121.

As illustrated in FIG. 10, in calculating a dimension-1 soft-input value, the dimension-1 soft-input value calculating unit 111 first has read information inputted thereto from the read information memory 101 and has a dimension-1 intermediate value and a dimension-2 intermediate value inputted thereto from the intermediate value memory 102 (step S121).

Then the dimension-1 soft-input value calculating unit 111 calculates an approximate value of a dimension-2 external value from the inputted read information, dimension-1 intermediate value, and dimension-2 intermediate value. Specifically, the dimension-1 soft-input value calculating unit 111 calculates a dimension-2 logarithmic posteriori probability ratio from a dimension-2 MAP decoded word out of the dimension-2 intermediate value, the posteriori probability of the dimension-2 MAP decoded word, and the posteriori probability of the competing decoded word of each dimension-2 bit (step S122).

Then, in the case of usual Max-log-MAP decoding, the dimension-2 external value can be obtained by subtracting a dimension-2 soft-input value from the dimension-2 logarithmic posteriori probability ratio, but in the present embodiment the dimension-2 soft-input value is unknown at the present. Hence, in the present embodiment the dimension-2 external value (approximate value) is approximately calculated by substituting read information as an approximate value for the dimension-2 soft-input value to subtract the read information from the dimension-2 logarithmic posteriori probability ratio (step S123).

Then the approximate value of the dimension-2 external value calculated at step S123 and read information are added to calculate a dimension-1 soft-input value (step S124). Then the calculated dimension-1 soft-input value is outputted on a dimension-1-component-code-by-dimension-1-component-code basis to the dimension-1 component code SISO decoder 112 (step S125), and the process returns to the operation shown in FIG. 8.

As described above, also in the case of substituting read information as an approximate value for a soft-input value, the soft-input value finally calculated, closely approximates a soft-input value that is to be calculated in normal turbo decoding. This indicates that the external value memories 913 and 923 for respective dimensions in the configuration illustrated in, e.g., FIG. 3 can be substituted with the intermediate value memory 102 smaller in capacity according to the present embodiment.

Specifically, usual Max-log-MAP decoding needs, for each dimension, a memory which holds external values including a variety of information that is channel values, input external value information, hard-decision values, and reliability, but in the present embodiment, as external values, only hard-decision values (corresponding to MAP decoded words) and reliability information need be held, and in addition one memory can be shared for all the dimensions. As a result, according to the present embodiment, the amount of memory necessary for decoding can be reduced.

Second Embodiment

Next, a memory system according to a second embodiment will be described in detail below with reference to the drawings. The configuration of the memory system including a coding/decoding unit of the present embodiment may be the same as that of the memory system 1 illustrated using FIGS. 5 to 7 and 9 in the first embodiment, and thus duplicate description thereof is omitted from here. The processing flow of the approximating turbo decoder according to the present embodiment may be the same as the processing flow described using FIG. 8 in the first embodiment, and thus duplicate description thereof is omitted from here. Note that in the present embodiment the operation flow of the dimension-1 soft-input value calculating unit 111 and the dimension-2 soft-input value calculating unit 121 is different from the operation flow illustrated using FIG. 10 in the first embodiment.

Figure 11:
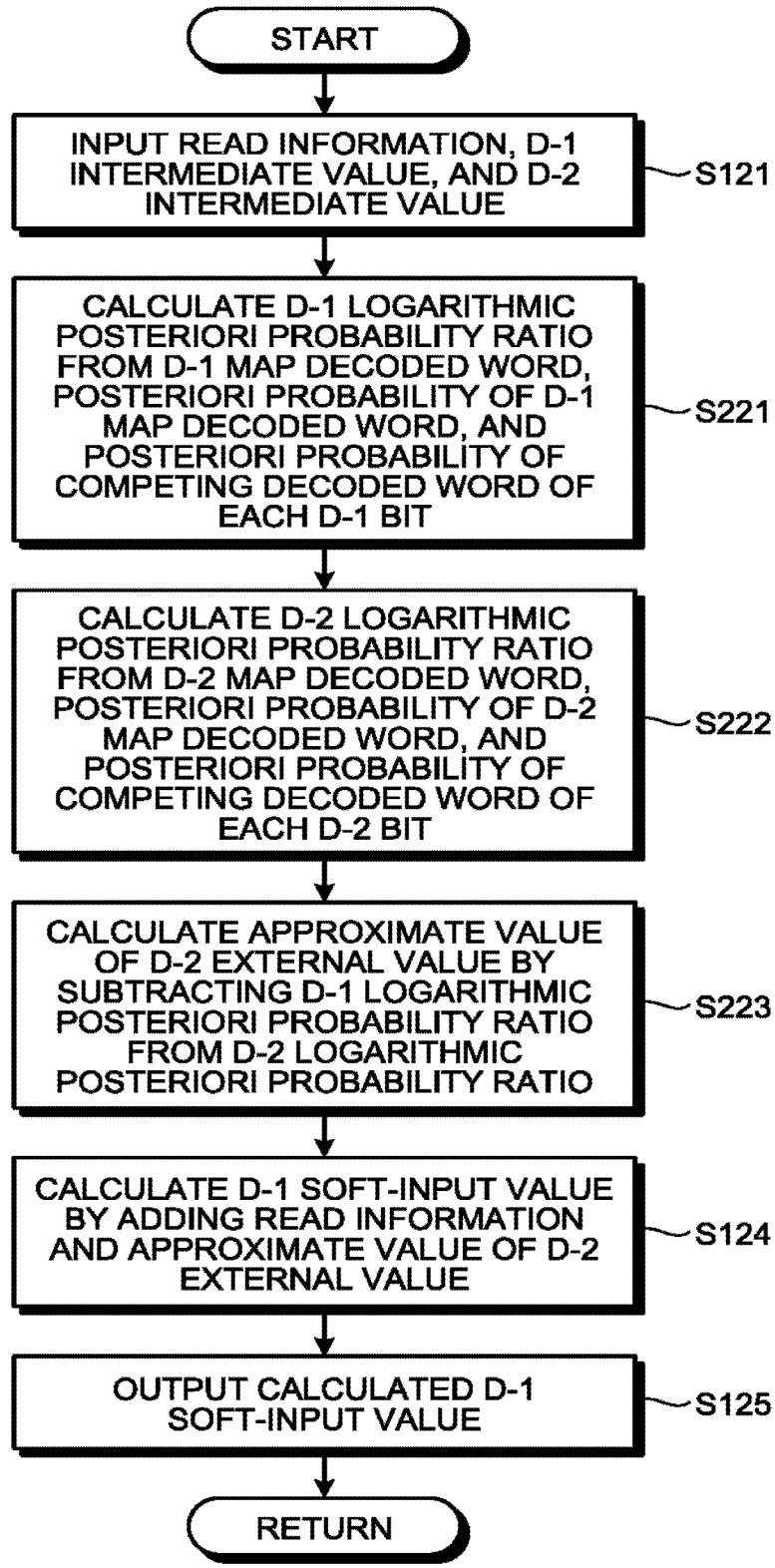
FIG. 11 is a flow chart illustrating an example operation flow of the dimension-1 soft-input value calculating unit according to a second embodiment.

FIG. 11 is a flow chart illustrating an example operation flow of the dimension-1 soft-input value calculating unit according to the present embodiment. Although FIG. 11 illustrates the operation of the dimension-1 soft-input value calculating unit 111, regarding the operation, the same applies to the dimension-2 soft-input value calculating unit 121. In the operation shown in FIG. 11, the same step operations as are shown in FIG. 10 are denoted by the same reference numerals, with detailed description thereof being omitted.

As shown in FIG. 11, the dimension-1 soft-input value calculating unit 111 first has read information, a dimension-1 intermediate value, and a dimension-2 intermediate value inputted thereto as in step S121 in FIG. 10 and calculates an approximate value of a dimension-2 external value from the inputted read information, dimension-1 intermediate value, and dimension-2 intermediate value. Note that in the present embodiment the dimension-1 soft-input value calculating unit 111 calculates a dimension-1 logarithmic posteriori probability ratio from a dimension-1 MAP decoded word out of the dimension-1 intermediate value, the posteriori probability of the dimension-1 MAP decoded word, and the posteriori probability of the competing decoded word of each dimension-1 bit (step S221). Subsequently, the dimension-1 soft-input value calculating unit 111 calculates a dimension-2 logarithmic posteriori probability ratio from a dimension-2 MAP decoded word out of the dimension-2 intermediate value, the posteriori probability of the dimension-2 MAP decoded word, and the posteriori probability of the competing decoded word of each dimension-2 bit (step S222).

Then, in the case of usual Max-log-MAP decoding, the dimension-2 external value can be obtained by subtracting a dimension-2 soft-input value from the dimension-2 logarithmic posteriori probability ratio, but in the present embodiment the dimension-2 soft-input value is unknown at the present as in the first embodiment. Hence, in the present embodiment the dimension-2 external value (approximate value) is approximately calculated by substituting the dimension-1 logarithmic posteriori probability ratio as an approximate value for the dimension-2 soft-input value to subtract the dimension-1 logarithmic posteriori probability ratio from the dimension-2 logarithmic posteriori probability ratio (step S223).

Then the dimension-1 soft-input value calculating unit 111 performs the same step operations as are described in steps 124, 125 of FIG. 10, that is, adds the approximate value of the dimension-2 external value and read information to calculate a dimension-1 soft-input value (step S124) and outputs the calculated dimension-1 soft-input value on a dimension-1-component-code-by-dimension-1-component-code basis to the dimension-1 component code SISO decoder 112 (step S125), and the process returns to the operation shown in FIG. 8.

As described above, also in the case of substituting a logarithmic posteriori probability ratio of one dimension as an approximate value for a soft-input value of the other dimension, the soft-input value finally calculated, closely approximates a soft-input value that is to be calculated in normal turbo decoding. Therefore, as in the first embodiment, the external value memories 913 and 923 for respective dimensions in the configuration illustrated in, e.g., FIG. 3 can be substituted with the intermediate value memory 102 smaller in capacity, so that the amount of memory necessary for decoding can be reduced.

Because the other configurations, operations, and effects are the same as in the above embodiment, detailed description thereof is omitted from here.

Third Embodiment

Next, a memory system according to a third embodiment will be described. The operation flows can be used selectively switching depending on specific conditions between the operation flow of the dimension-1 soft-input value calculating unit 111 or the dimension-2 soft-input value calculating unit 121 as illustrated using FIG. 10 in the first embodiment and that of the dimension-1 soft-input value calculating unit 111 or the dimension-2 soft-input value calculating unit 121 as illustrated using FIG. 11 in the second embodiment. The soft-input value calculating unit can be configured to switch the operation flow to perform based on the posteriori probability of the MAP decoded word: for example, if the posteriori probability of the dimension-1 or dimension-2 MAP decoded word is higher than a predetermined threshold, a dimension-1 soft-input value or a dimension-2 soft-input value is obtained using the operation flow shown in FIG. 11, and otherwise a dimension-1 soft-input value or a dimension-2 soft-input value is obtained using the operation flow shown in FIG. 10.

Also in this configuration, as in the above embodiments, the external value memories 913 and 923 for respective dimensions in the configuration illustrated in, e.g., FIG. 3 can be substituted with the intermediate value memory 102 smaller in capacity, so that the amount of memory necessary for decoding can be reduced.

Because the other configurations, operations, and effects are the same as in the above embodiments, detailed description thereof is omitted from here.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a nonvolatile memory configured to record a multidimensional error correcting code in which at least one symbol from among symbols constituting a code is protected by at least a first component code and a second component code different from the first component code;
   a memory interface configured to read the multidimensional error correcting code recorded in the nonvolatile memory in the form of soft-decision values as read information;
   a read information memory configured to hold the read information;
   an intermediate value memory configured to hold a first decoded word of the first component code and first reliability information concerning the first decoded word and a second decoded word of the second component code and second reliability information concerning the second decoded word;
   a first soft-input value calculating unit configured to calculate a first soft-input value of the first component code based on at least the second decoded word and the second reliability information held in the intermediate value memory and read information concerning the second component code held in the read information memory;
   a first soft-decision decoder configured to decode the first soft-input value of the first component code for the first component code, thereby calculating a new first decoded word of the first component code and new first reliability information concerning the new first decoded word and updates the first decoded word and the first reliability information in the intermediate value memory with the calculated new first decoded word and the calculated new first reliability information, the new first decoded word and the new first reliability information in the intermediate value memory being a latest first decoded word and a latest first reliability information;
a second soft-input value calculating unit configured to calculate a second soft-input value of the second component code based on at least the first decoded word and the first reliability information held in the intermediate value memory and read information concerning the first component code held in the read information memory; and
a second soft-decision decoder configured to decode the second soft-input value of the second component code for the second component code, thereby calculating a new second decoded word of the second component code and new second reliability information concerning the new second decoded word and updates the second decoded word and the second reliability information in the intermediate value memory with the calculated new second decoded word and the calculated new second reliability information, the new second decoded word and the new second reliability information in the intermediate value memory being a latest second decoded word and a latest second reliability information,
wherein if it is determined that an output decoded word calculated from the read information, the first and second decoded words, and the first and second reliability information is a correct output decoded word, the output decoded word is outputted,
wherein the first soft-input value calculating unit is configured to:
calculate a logarithmic posteriori probability ratio based on the result of decoding the second component code from the second decoded word and the second reliability information held in the intermediate value memory;
subtract the read information from the logarithmic posteriori probability ratio based on the result of decoding the second component code, thereby calculating an approximate value of an external value of the second component code; and
add at least the approximate value of the external value of the second component code and the read information, thereby calculating the first soft-input value of the first component code.

2. The memory system according to claim 1, wherein the first soft-input value of the first component code is the result of adding at least an approximate value of an external value of the second component code and the read information, and
wherein the second soft-input value of the second component code is the result of adding at least an approximate value of an external value of the first component code and the read information.

3. The memory system according to claim 1, wherein the second soft-input value calculating unit is configured to:
calculate a logarithmic posteriori probability ratio based on the result of decoding the first component code from the first decoded word and the first reliability information held in the intermediate value memory;
subtract the read information from the logarithmic posteriori probability ratio based on the result of decoding the first component code, thereby calculating an approximate value of an external value of the first component code; and
add at least the approximate value of the external value of the first component code and the read information, thereby calculating the second soft-input value of the second component code.

4. The memory system according to claim 1, wherein at least one of the first soft-decision decoder and the second soft-decision decoder calculates the new first or second decoded word by Chase decoding.

5. The memory system according to claim 1, wherein at least one of the first soft-decision decoder and the second soft-decision decoder calculates the new first or second decoded word by Ordered Statistics decoding.

6. The memory system according to claim 1, wherein
the first reliability information of the first decoded word includes a first distance between the first decoded word and the first soft-input value, and
the second reliability information of the second decoded word includes a second distance between the first decoded word and the second soft-input value.

7. The memory system according to claim 1, wherein
the first reliability information of the first decoded word includes a first value indicating probability that the first decoded word is a correct decoded word, and
the second reliability information of the second decoded word includes a second value indicating probability that the second decoded word is a correct decoded word.

8. A memory system comprising:
a nonvolatile memory configured to record a multidimensional error correcting code in which at least one symbol from among symbols constituting a code is protected by at least a first component code and a second component code different from the first component code;
a memory interface configured to read the multidimensional error correcting code recorded in the nonvolatile memory in the form of soft-decision values as read information;
a read information memory configured to hold the read information;
an intermediate value memory configured to hold a first decoded word of the first component code and first reliability information concerning the first decoded word and a second decoded word of the second component code and second reliability information concerning the second decoded word;
a first soft-input value calculating unit configured to calculate a first soft-input value of the first component code based on at least the second decoded word and the second reliability information held in the intermediate value memory and read information concerning the second component code held in the read information memory;
a first soft-decision decoder configured to decode the first soft-input value of the first component code for the first component code, thereby calculating a new first decoded word of the first component code and new first reliability information concerning the new first decoded word and updates the first decoded word and the first reliability information in the intermediate value memory with the calculated new first decoded word and the calculated new first reliability information, the new first decoded word and the new first reliability information in the intermediate value memory being a latest first decoded word and a latest first reliability information;
a second soft-input value calculating unit configured to calculate a second soft-input value of the second component code based on at least the first decoded word and the first reliability information held in the intermediate value memory and read information concerning the first component code held in the read information memory; and a second soft-decision decoder configured to decode the second soft-input value of the second component code for the second component code, thereby calculating a new second decoded word of the second component code and new second reliability information concerning the new second decoded word and updates the second decoded word and the second reliability information in the intermediate value memory with the calculated new second decoded word and the calculated new second reliability information, the new second decoded word and the new second reliability information in the intermediate value memory being a latest second decoded word and a latest second reliability information, wherein if it is determined that an output decoded word calculated from the read information, the first and second decoded words, and the first and second reliability information is a correct output decoded word, the output decoded word is outputted, wherein the first soft-input value calculating unit is configured to:

calculate a logarithmic posteriori probability ratio based on the result of decoding the first component code from the first decoded word and the first reliability information in the intermediate value memory;

calculate a logarithmic posteriori probability ratio based on the result of decoding the second component code from the second decoded word and the second reliability information in the intermediate value memory;

subtract the logarithmic posteriori probability ratio based on the result of decoding the first component code from the logarithmic posteriori probability ratio based on the result of decoding the second component code, thereby calculating an approximate value of an external value of the second component code; and add at least the approximate value of the external value of the second component code and the read information, thereby calculating the first soft-input value of the first component code.

9. The memory system according to claim 8, wherein the second soft-input value calculating unit is configured to:

calculate a logarithmic posteriori probability ratio based on the result of decoding the second component code from the second decoded word and the second reliability information in the intermediate value memory;

calculate a logarithmic posteriori probability ratio based on the result of decoding the first component code from the first decoded word and the first reliability information in the intermediate value memory;

subtract the logarithmic posteriori probability ratio based on the result of decoding the second component code from the logarithmic posteriori probability ratio based on the result of decoding the first component code, thereby calculating an approximate value of an external value of the first component code; and add at least the approximate value of the external value of the first component code and the read information, thereby calculating the second soft-input value of the second component code.

10. The memory system according to claim 8, wherein at least one of the first soft-decision decoder and the second soft-decision decoder calculates the new first or second decoded word by Chase decoding.

11. The memory system according to claim 8, wherein at least one of the first soft-decision decoder and the second soft-decision decoder calculates the new first or second decoded word by Ordered Statistics decoding.

12. The memory system according to claim 8, wherein the first reliability information of the first decoded word includes a first distance between the first decoded word and the first soft-input value, and the second reliability information of the second decoded word includes a second distance between the first decoded word and the second soft-input value.

13. The memory system according to claim 8, wherein the first reliability information of the first decoded word includes a first value indicating probability that the first decoded word is a correct decoded word, and the second reliability information of the second decoded word includes a second value indicating probability that the second decoded word is a correct decoded word.

14. A memory system comprising:

a nonvolatile memory configured to record a multidimensional error correcting code in which at least one symbol from among symbols constituting a code is protected by at least a first component code and a second component code different from the first component code;

a memory interface configured to read the multidimensional error correcting code recorded in the nonvolatile memory in the form of soft-decision values as read information;

a read information memory configured to hold the read information;

an intermediate value memory configured to hold a first decoded word of the first component code and first reliability information concerning the first decoded word and a second decoded word of the second component code and second reliability information concerning the second decoded word;

a first soft-input value calculating unit configured to calculate a first soft-input value of the first component code based on at least the second decoded word and the second reliability information held in the intermediate value memory and read information concerning the second component code held in the read information memory;

a first soft-decision decoder configured to decode the first soft-input value of the first component code for the first component code, thereby calculating a new first decoded word of the first component code and new first reliability information concerning the new first decoded word and updates the first decoded word and the first reliability information in the intermediate value memory with the calculated new first decoded word and the calculated new first reliability information, the new first decoded word and the new first reliability information in the intermediate value memory being a latest first decoded word and a latest first reliability information;

a second soft-input value calculating unit configured to calculate a second soft-input value of the second component code based on at least the first decoded word and the first reliability information held in the intermediate value memory and read information concerning the first component code held in the read information memory; and a second soft-decision decoder configured to decode the second soft-input value of the second component code for the second component code, thereby calculating a new second decoded word of the second component code and new second reliability information concerning the new second decoded word and updates the second decoded word and the second reliability information in the intermediate value memory with the calculated new second decoded word and the calculated new second reliability information, the new second decoded word and the new second reliability information in the intermediate value memory being a latest second decoded word and a latest second reliability information, wherein if it is determined that an output decoded word calculated from the read information, the first and second decoded words, and the first and second reliability information is a correct output decoded word, the output decoded word is outputted, wherein the first soft-input value calculating unit is configured to switch a process to execute based on the first reliability information between:

a first process that calculates a logarithmic posteriori probability ratio based on the result of decoding the second component code from the second decoded word and the second reliability information held in the intermediate value memory, subtracts the read information from the logarithmic posteriori probability ratio based on the result of decoding the second component code, thereby calculating an approximate value of an external value of the second component code, and adds at least the approximate value of the external value of the second component code and the read information, thereby calculating the first soft-input value of the first component code, and a second process that calculates a logarithmic posteriori probability ratio based on the result of decoding the first component code from the first decoded word and the first reliability information in the intermediate value memory, calculates a logarithmic posteriori probability ratio based on the result of decoding the second component code from the second decoded word and the second reliability information in the intermediate value memory, subtracts the logarithmic posteriori probability ratio based on the result of decoding the first component code from the logarithmic posteriori probability ratio based on the result of decoding the second component code, thereby calculating an approximate value of an external value of the second component code, and adds at least the approximate value of the external value of the second component code and the read information, thereby calculating the first soft-input value of the first component code.

15. The memory system according to claim 14, wherein the second soft-input value calculating unit is configured to switch a process to execute based on the second reliability information between:

a third process that calculates a logarithmic posteriori probability ratio based on the result of decoding the first component code from the first decoded word and the first reliability information held in the intermediate value memory, subtracts the read information from the logarithmic posteriori probability ratio based on the result of decoding the first component code, thereby calculating an approximate value of an external value of the first component code, and adds at least the approximate value of the external value of the first component code and the read information, thereby calculating the second soft-input value of the second component code, and a fourth process that calculates a logarithmic posteriori probability ratio based on the result of decoding the second component code from the second decoded word and the second reliability information in the intermediate value memory, calculates a logarithmic posteriori probability ratio based on the result of decoding the first component code from the first decoded word and the first reliability information in the intermediate value memory, subtracts the logarithmic posteriori probability ratio based on the result of decoding the second component code from the logarithmic posteriori probability ratio based on the result of decoding the first component code, thereby calculating an approximate value of an external value of the first component code, and adds at least the approximate value of the external value of the first component code and the read information, thereby calculating the second soft-input value of the second component code.

16. The memory system according to claim 14, wherein at least one of the first soft-decision decoder and the second soft-decision decoder calculates the new first or second decoded word by Chase decoding.

17. The memory system according to claim 14, wherein at least one of the first soft-decision decoder and the second soft-decision decoder calculates the new first or second decoded word by Ordered Statistics decoding.

18. The memory system according to claim 14, wherein the first reliability information of the first decoded word includes a first distance between the first decoded word and the first soft-input value, and the second reliability information of the second decoded word includes a second distance between the first decoded word and the second soft-input value.

19. The memory system according to claim 14, wherein the first reliability information of the first decoded word includes a first value indicating probability that the first decoded word is a correct decoded word, and the second reliability information of the second decoded word includes a second value indicating probability that the second decoded word is a correct decoded word.

* * * * *